United States Patent
Lin

(10) Patent No.: US 8,570,206 B1
(45) Date of Patent: Oct. 29, 2013

(54) MULTI-BIT PER CYCLE SUCCESSIVE APPROXIMATION REGISTER ADC

(75) Inventor: Jin-Fu Lin, Tainan (TW)

(73) Assignee: Himax Technologies Limited, Tainan (TW)

(*) Notice: Subject to any disclaimer, the term of this patent is extended or adjusted under 35 U.S.C. 154(b) by 3 days.

(21) Appl. No.: 13/455,515

(22) Filed: Apr. 25, 2012

(51) Int. Cl.
*H03M 1/34* (2006.01)

(52) U.S. Cl.
USPC ........... 341/163; 341/155; 341/160; 341/164; 341/165

(58) Field of Classification Search
USPC .................................................. 341/140–165
See application file for complete search history.

(56) References Cited

U.S. PATENT DOCUMENTS

| | | | |
|---|---|---|---|
| 6,157,338 A * | 12/2000 | Gross, Jr. ...................... | 341/161 |
| 6,879,277 B1 * | 4/2005 | Cai ................................ | 341/155 |
| 6,914,550 B2 * | 7/2005 | Cai ................................ | 341/155 |
| 7,956,787 B2 * | 6/2011 | Westwick et al. .............. | 341/155 |
| 8,284,090 B2 * | 10/2012 | Maurino ........................ | 341/156 |
| 8,319,675 B2 * | 11/2012 | Ogawa et al. .................. | 341/155 |
| 2013/0106629 A1 * | 5/2013 | Nys et al. ...................... | 341/110 |

* cited by examiner

*Primary Examiner* — Lam T Mai
(74) *Attorney, Agent, or Firm* — Stout, Uxa, Buyan & Mullins, LLP

(57) ABSTRACT

A main digital-to-analog converter (DAC) receives at least one input and generates an adjusted input. A SAR unit generates a code for controlling the main DAC based on a comparison output of a comparing unit that receives the adjusted input. A reference generator, under control of the generated code, generates at least one reference voltage, which is then forwarded to the comparing unit in each corresponding cycle for defining a search range of each cycle, wherein an absolute value of the reference voltage of a latter cycle is less than the reference voltage of a former cycle such that the search range of the latter cycle is smaller than the search range of the former cycle, and search ranges of all the cycles are centered at a base voltage.

11 Claims, 6 Drawing Sheets

| phase | p1 | p2 | p3 |
|---|---|---|---|
| $V_{rp}$ | $V_{cm}+\Delta V/2$ | $V_{cm}+\Delta V/8$ | $V_{cm}+\Delta V/32$ |
| $V_{rn}$ | $V_{cm}-\Delta V/2$ | $V_{cm}-\Delta V/8$ | $V_{cm}-\Delta V/32$ |

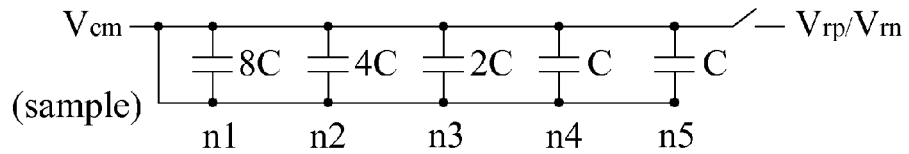
(sample)
FIG.6A
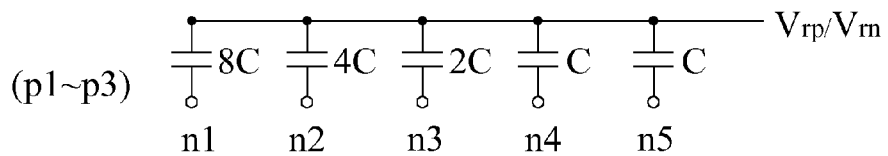
(p1~p3)
FIG.6B
For $V_{rp}$
|        | n1      | n2      | n3      | n4      | n5      |
|--------|---------|---------|---------|---------|---------|
| sample | $V_{cm}$  | $V_{cm}$  | $V_{cm}$  | $V_{cm}$  | $V_{cm}$  |
| p1     | $V_{refp}$ | $V_{cm}$  | $V_{cm}$  | $V_{cm}$  | $V_{cm}$  |
| p2     | $V_{refp}$ | $V_{refn}$ | $V_{cm}$  | $V_{cm}$  | $V_{cm}$  |
| p3     | $V_{refp}$ | $V_{refn}$ | $V_{refn}$ | $V_{refn}$ | $V_{refn}$ |
FIG.6C
For $V_{rn}$
|        | n1      | n2      | n3      | n4      | n5      |
|--------|---------|---------|---------|---------|---------|
| sample | $V_{cm}$  | $V_{cm}$  | $V_{cm}$  | $V_{cm}$  | $V_{cm}$  |
| p1     | $V_{refn}$ | $V_{cm}$  | $V_{cm}$  | $V_{cm}$  | $V_{cm}$  |
| p2     | $V_{refn}$ | $V_{refp}$ | $V_{refp}$ | $V_{cm}$  | $V_{cm}$  |
| p3     | $V_{refn}$ | $V_{refp}$ | $V_{refp}$ | $V_{refp}$ | $V_{refp}$ |
FIG.6D

US 8,570,206 B1

MULTI-BIT PER CYCLE SUCCESSIVE APPROXIMATION REGISTER ADC

BACKGROUND OF THE INVENTION

1. Field of the Invention

The present invention generally relates to an analog-to-digital converter (ADC), and more particularly to a multi-bit per cycle successive approximation register (SAR) ADC.

2. Description of Related Art

A successive approximation register (SAR) analog-to-digital converter (ADC) is a type of ADC that converts an analog signal to a digital code equivalent of the analog signal. FIG. 1 shows a schematic diagram illustrating a conventional SAR ADC. The SAR ADC performs conversion by comparison and searching through all possible quantization levels, i.e., binary search, to obtain a digital output. The SAR ADC requires less silicon area and the associated cost than other ADC architectures. However, as the conventional SAR ADC as exemplified in FIG. 1 converts one bit per cycle, it therefore does not fit for high speed applications.

In order to speed up the operation of the SAR ADC, a 2-bit per cycle (or 2b/cycle) SAR ADC is proposed. FIG. 2 shows a block diagram illustrating a conventional 2b/cycle SAR ADC. Compared with the 1b/cycle SAR ADC of FIG. 1, the 2b/cycle SAR ADC involves triple capacitive ADCs (designated as C-net) and thus causes triple loading for a previous stage (e.g., a source follower made of a current source 11 and a p-type transistor 12) in the SAR ADC. Moreover, as more comparators 13 are used in the 2b/cycle SAR ADC (FIG. 2) than the 1b/cycle SAR ADC (FIG. 1), mismatch issue among the comparators in the 2b/cycle SAR ADC need be resolved.

For the foregoing reasons, a need has arisen to propose a novel multi-bit per cycle SAR ADC to overcome the disadvantages as mentioned above.

SUMMARY OF THE INVENTION

In view of the foregoing, it is an object of the embodiment of the present invention to provide a multi-bit per cycle successive approximation register (SAR) analog-to-digital converter (ADC) such that a higher speed may be acquired, a simpler switching scheme may be needed and comparators with less offset accuracy may be used in the SAR ADC, thereby substantially reducing silicon area, the associated cost and power consumption.

According to one embodiment, a multi-bit per cycle SAR ADC includes a main digital-to-analog converter (DAC), a comparing unit, a SAR unit and a reference generator. The main DAC is coupled to receive at least one input, at least one output node of the main DAC generating an adjusted input. The comparing unit includes a plurality of comparators coupled to receive the adjusted input. The SAR unit is configured to generate a code for controlling the main DAC to generate the adjusted input based on a comparison output of the comparing unit. The reference generator, under control of the generated code, generates at least one reference voltage, which is then forwarded to the comparing unit in each corresponding cycle for defining a search range of each cycle, wherein an absolute value of the reference voltage of a latter cycle is less than the reference voltage of a former cycle such that the search range of the latter cycle is smaller than the search range of the former cycle, and search ranges of all the cycles are centered at a base voltage.

BRIEF DESCRIPTION OF THE DRAWINGS

FIG. 6A to FIG. 6D schematically show a capacitive DAC implementing the reference generator and its connection.

DETAILED DESCRIPTION OF THE INVENTION

Figure 3:
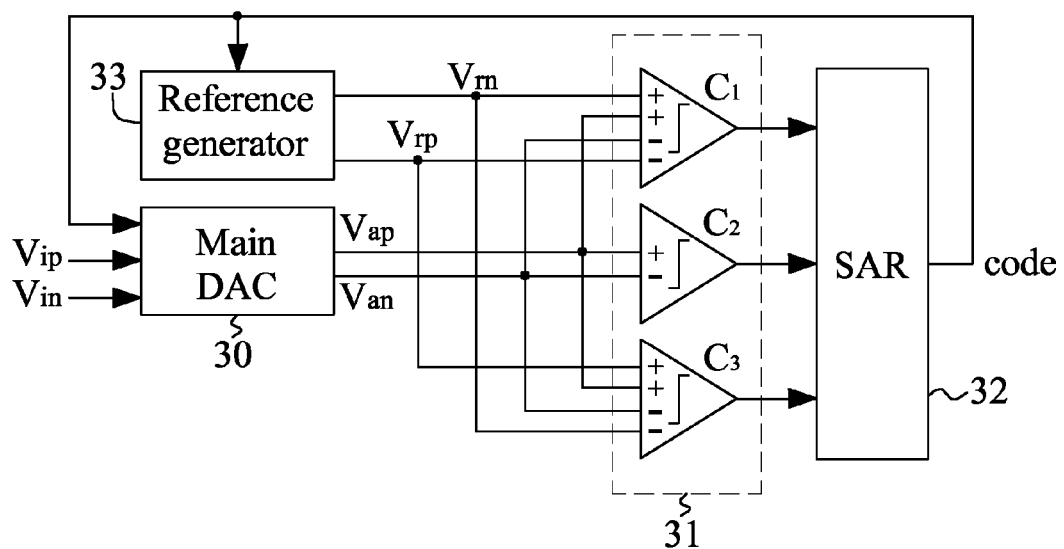
FIG. 3 shows a block diagram illustrating a multi-bit per cycle SAR ADC according to one embodiment of the present invention.

FIG. 3 shows a block diagram illustrating a multi-bit per cycle successive approximation register (SAR) analog-to-digital converter (ADC) according to one embodiment of the present invention. For better understanding the invention, a 2-bit per cycle (or 2b/cycle) SAR ADC is illustrated. However, the present invention may generally be adaptable to a multi-bit per cycle SAR ADC.

Figure 1:
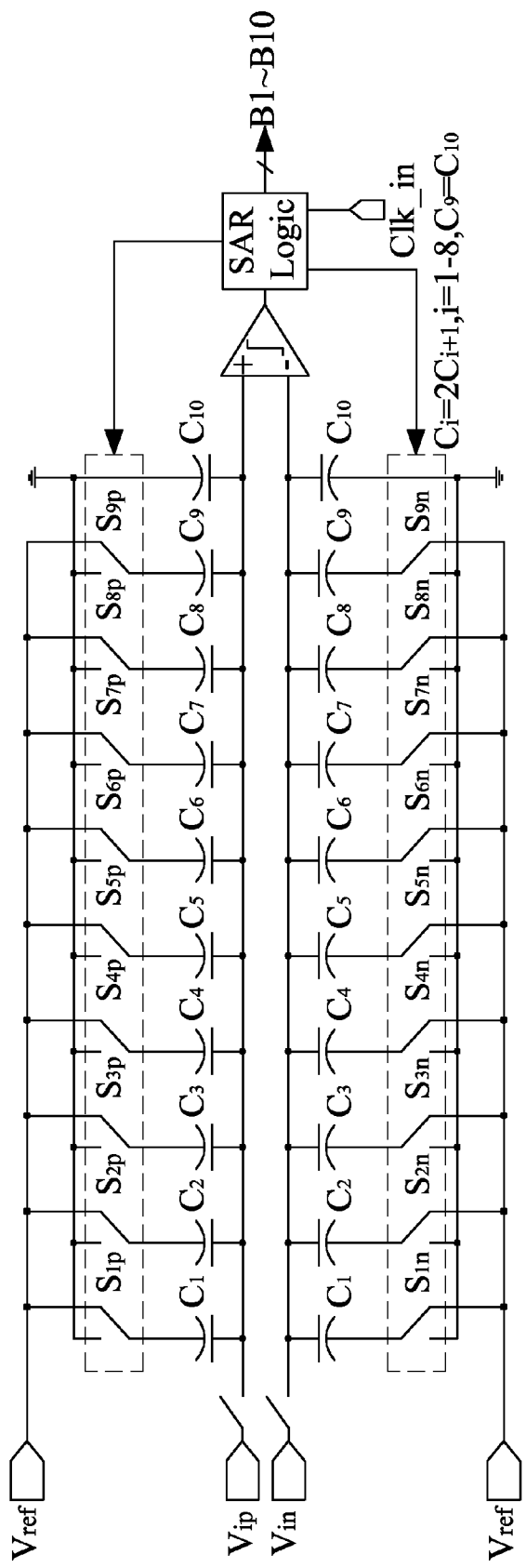
FIG. 1 shows a schematic diagram illustrating a conventional 1b/cycle successive approximation register (SAR) analog-to-digital converter (ADC)

In the embodiment, a main digital-to-analog converter (DAC) 30 is coupled to receive a positive input Vip and a negative input Vin. Although a differential SAR ADC with the differential input pair Vip/Vin is illustrated in the embodiment, it is appreciated that the invention may be well adapted to a single-ended SAR ADC with a single input. The main DAC 30 may include two capacitive DACs (i.e., a first capacitive DAC and a second capacitive DAC) similar to the capacitive DACs of a conventional 1-bit per cycle SAR DAC as exemplified in FIG. 1. The input nodes of the first/second capacitive DACs are electrically coupled to receive the positive/negative inputs Vip/Vin respectively via switches, and the output nodes of the first/second capacitive DACs generate a positive adjusted input Vap and a negative adjusted input Van respectively, which are then fed to a comparing unit 31. In the embodiment for a 2b/cycle SAR ADC, the comparing unit 31 includes three (analog) comparators, that is, a first comparator C1, a second comparator C2 and a third comparator C3. In general, for an m-bit per cycle SAR ADC, the comparing unit 31 includes ($2^m-1$) comparators.

Figures 4A, 4B:
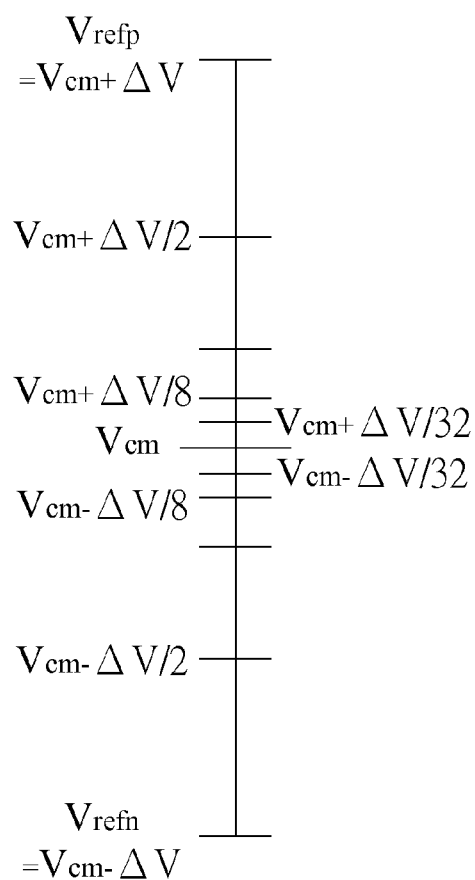
FIG. 4A shows a table listing corresponding positive/negative reference voltages in three consecutive phases.
FIG. 4B designates the various positive/negative reference voltages of FIG. 4A on a scale of full reference-voltage range.

Based on comparison outputs of the comparing unit 31, a SAR unit 32 generates a (digital) code for switching the capacitive DACs of the main DAC 30. The generated code from the SAR unit 32 is also provided to control a reference generator 33, which generates a positive reference voltage Vrp and a negative reference voltage Vrn forwarding to the comparing unit 31 in each corresponding conversion cycle (or phase). FIG. 4A shows a table listing corresponding positive/negative reference voltages Vrp/Vrn in three consecutive phases (or cycles) (i.e., p1, p2 and p3). It is noted that an absolute value of the positive/negative reference voltages Vrp/Vrn of a latter phase is less than that of a former phase. Generally speaking, the positive reference voltage Vrp may be expressed as $Vcm+\Delta V/2^{2p-1}$ in a phase p, and the negative reference voltage Vrn may be expressed as $Vcm-\Delta V/2^{2p-1}$ in a phase p, where Vcm is a base voltage (e.g., a center voltage) in a reference-voltage range (or search range). FIG. 4B designates the various positive/negative reference voltages Vrp/Vrn of FIG. 4A on a scale of full reference-voltage range from a top reference voltage Vrefp (=Vcm+ΔV) to a bottom reference voltage Vrefn (=Vcm−ΔV), with Vcm on the center of the scale.

Referring back to FIG. 3, it is noted that the first comparator C1 and the third comparator C3 each has four input nodes. With respect to the first comparator C1, it performs the following four-input comparison: (Vap−Van)−(Vrp−Vrn). In other words, the positive adjusted input Vap is compared with the negative adjusted input Van, resulting in a (first) differential adjusted input; the positive reference voltage Vrp is compared with the negative reference voltage Vrn, resulting in a (first) differential reference voltage. Finally, the (first) differential adjusted input is then compared with the (first) differential reference voltage. With respect to the third comparator C3, it performs the following four-input comparison: (Vap−Van)−(Vrn−Vrp). In other words, the positive adjusted input Vap is compared with the negative adjusted input Van, resulting in a (third) differential adjusted input; the negative reference voltage Vrn is compared with the positive reference voltage Vrp, resulting in a (third) differential reference voltage. Finally, the (third) differential adjusted input is then compared with the (third) differential reference voltage. With respect to the second comparator C2, it performs the following two-input comparison: (Vap−Van). In other words, the positive adjusted input Vap is compared with the negative adjusted input Van, resulting in a (second) differential adjusted input.

Figure 5:
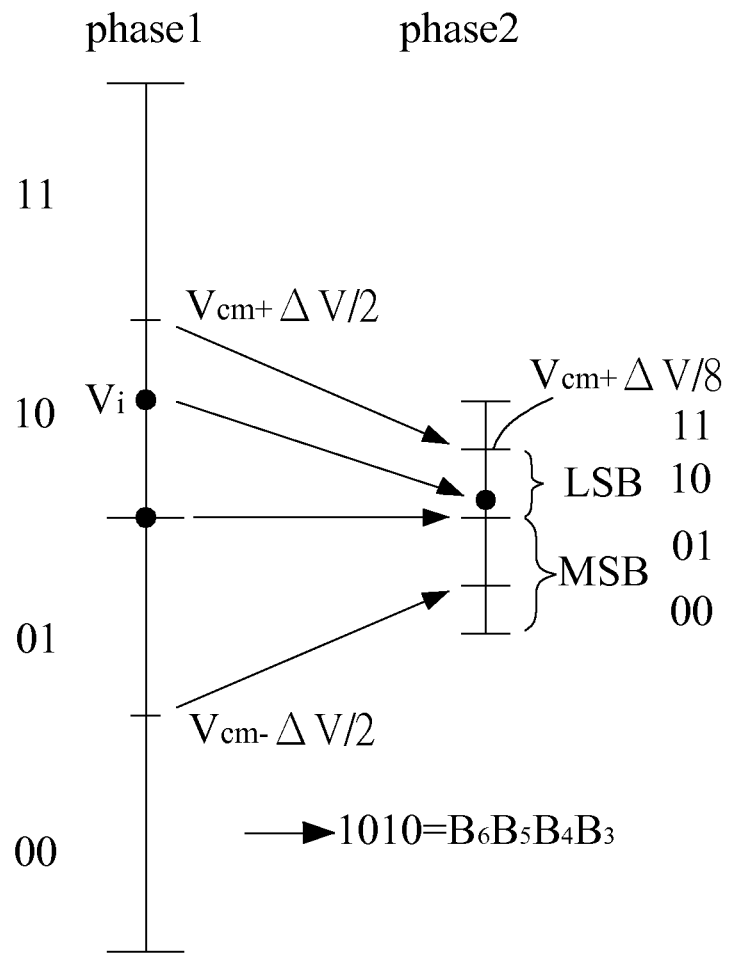
FIG. 5 illustrates an operation in the 2b/cycle SAR ADC of FIG. 3.

FIG. 5 illustrates an operation in the 2b/cycle SAR ADC of FIG. 3. As a 6-bit SAR ADC is demonstrated, three cycles (or phases) are thus required to complete the conversion to obtain a 6-bit code $B_6B_5B_4B_3B_2B_1$. In phase 1, the reference generator 33 provides a positive reference voltage Vcm+ΔV/2 and a negative reference voltage Vcm−ΔV/2. The voltages (Vcm+ΔV/2), Vcm and (Vcm−ΔV/2) equally divides the full reference-voltage range 2 ΔV into four segments: 00, 01, 10 and 11. An input Vi is subject to binary search through the full reference-voltage range 2ΔV. According to the result of the binary search, as the input Vi is located in the segment 10, the two most significant bits "10" (=$B_6B_5$) are thus obtained.

Subsequently, in phase 2, the reference generator 33 provides a positive reference voltage Vcm+ΔV/8 and a negative reference voltage Vcm−ΔV/8. The voltages (Vcm+ΔV/8), Vcm and (Vcm−ΔV/8) equally divides the reference-voltage range ΔV/2 centered at Vcm into four segments: 00, 01, 10 and 11. Before subjecting the input Vi into binary search, the input Vi should be adjusted according to the search result in the preceding phase (i.e., phase 1). For example, the input Vi is adjusted as follows: Vi'=Vi−$B_m$ΔV/2−$B_{m-1}$ ΔV/4, where $B_m$ and $B_{m-1}$ are more significant bits obtained from the preceding phase. The adjusted input Vi' is then subject to binary search through the reduced reference-voltage range ΔV/2. According to the result of the binary search, as the adjusted input Vi' is located in the segment 10, the two next significant bits "10" (=$B_4B_3$) are thus obtained.

In final phase 3 (not shown in FIG. 5), the reference generator 33 provides a positive reference voltage Vcm+ΔV/32 and a negative reference voltage Vcm−ΔV/32. The voltages (Vcm+ΔV/32), Vcm and (Vcm−ΔV/32) equally divides the reference-voltage range ΔV/8 centered at Vcm into four segments: 00, 01, 10 and 11. The adjusted input Vi' is subject to binary search through the reduced reference-voltage range ΔV/8. According to the result of the binary search, the two least significant bits ($B_2B_1$) are thus obtained.

The reference generator 33 discussed above may, but not necessarily, be implemented by a digital-to-analog converter (DAC), such as a capacitive DAC. FIG. 6A schematically shows a capacitive DAC implementing the reference generator 33 in a sample phase, in which all free nodes n1-n5 of the capacitors are connected to Vcm. FIG. 6B schematically shows a capacitive DAC implementing the reference generator 33 in conversion phases p1-p3, in which the free nodes n1-n5 are connected according to a table in FIG. 6C for generating the positive reference voltage Vrp and according to a table in FIG. 6D for generating the negative reference voltage Vrn.

Figure 7:
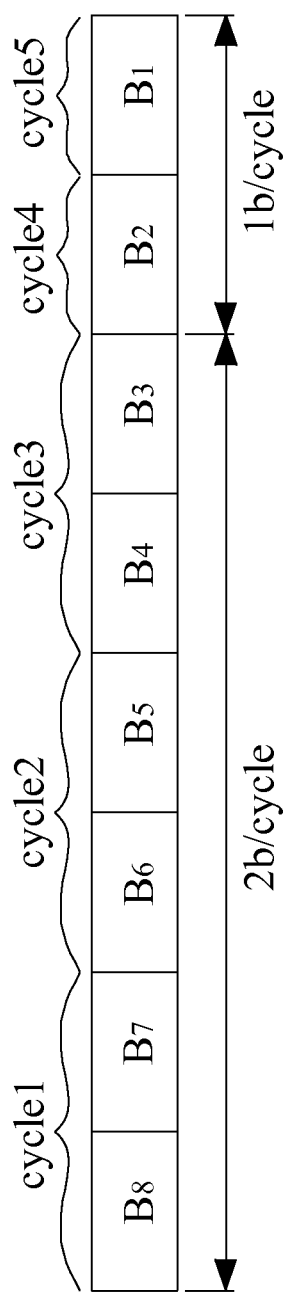
FIG. 7 shows an exemplary arrangement of converting an 8-bit input according to another embodiment of the present invention.

According to one aspect of the present invention, the offset accuracy of the comparators C1-C3 can be reduced without sacrificing performance of the SAR ADC. FIG. 7 shows an exemplary arrangement of converting an 8-bit input $B_8B_7B_6B_5B_4B_3B_2B_1$ according to another embodiment of the present invention. In the first three cycles, two bits are converted in each cycle; while, in the last two cycles, only one bit is converted in each cycle. Compared with the previous embodiment as discussed above, the present embodiment (FIG. 7) requires one more cycle (i.e., totaling five cycles) to complete the conversion rather than four cycles as in the previous embodiment. However, comparators with reduced offset accuracy may be used in the present embodiment. For example, comparators with offset accuracy of 6 bits, instead of 8 bits, may be used in the present embodiment. The reason is that, in the last two cycles, only the second comparator C2 (FIG. 3) is activated for converting bits $B_2$ and $B_1$, the performance of the SAR ADC will not be affected after reducing offset accuracy of the comparators. Therefore, circuit area and associated cost can be substantially reduced. Generally speaking, for an m-bit per cycle SAR ADC, some of its conversion cycles, particularly latter cycles, may be performed to convert n bits (n<m) per each cycle. As a result, comparators in the SAR ADC with reduced offset accuracy may be used without sacrificing performance of the SAR ADC.

Figure 2:
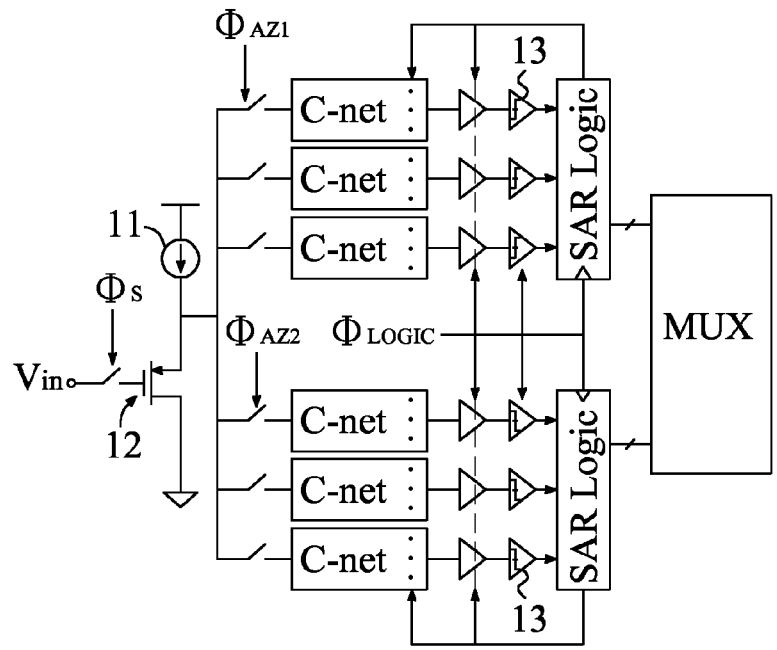
FIG. 2 shows a block diagram illustrating a conventional 2b/cycle SAR ADC.

Compared with the conventional multi-bit per cycle SAR ADC as exemplified in FIG. 2, the embodiments of the present invention require simpler switching scheme, and, more particularly, only one DAC 30 (plus a reference generator 33) is required instead of three DACs as in the conventional counterpart. Accordingly, circuit area and power consumption can be substantially reduced.

Although specific embodiments have been illustrated and described, it will be appreciated by those skilled in the art that various modifications may be made without departing from the scope of the present invention, which is intended to be limited solely by the appended claims.

What is claimed is:

1. A multi-bit per cycle successive approximation register (SAR) analog-to-digital converter (ADC), comprising:
    a main digital-to-analog converter (DAC) coupled to receive at least one input, at least one output node of the main DAC generating an adjusted input;
    a comparing unit including a plurality of comparators coupled to receive the adjusted input;
    a SAR unit configured to generate a code for controlling the main DAC to generate the adjusted input based on a comparison output of the comparing unit; and
    a reference generator under control of the generated code for generating at least one reference voltage, which is then forwarded to the comparing unit in each corresponding cycle for defining a search range of each cycle, wherein an absolute value of the reference voltage of a latter cycle is less than the reference voltage of a former cycle such that the search range of the latter cycle is smaller than the search range of the former cycle, and search ranges of all the cycles are centered at a base voltage.

2. The multi-bit per cycle SAR ADC of claim 1, wherein the at least one input comprises a positive input and a negative input; and the main DAC comprises a first capacitive DAC and a second capacitive DAC, input nodes of which being electrically coupled to receive the positive input and the negative inputs respectively via switches.

3. The multi-bit per cycle SAR ADC of claim 2, wherein the output nodes of the first and the second capacitive DACs generate a positive adjusted input and a negative adjusted input respectively, which are then fed to the comparing unit.

4. The multi-bit per cycle SAR ADC of claim 1, wherein the comparing unit comprises ($2^m-1$) of the comparators for an m-bit per cycle SAR ADC.

5. The multi-bit per cycle SAR ADC of claim 3, wherein the reference generator generates a positive reference voltage and a negative reference voltage forwarding to the comparing unit in each corresponding cycle; and the positive reference voltage has a value of $Vcm+\Delta V/2^{2p-1}$ in a phase p, and the negative reference voltage has a value of $Vcm-\Delta V/2^{2p-1}$ in a phase p, where Vcm is the base voltage of the search range.

6. The multi-bit per cycle SAR ADC of claim 5, wherein the comparing unit comprises:
a first comparator which performs a four-input comparison, wherein the positive adjusted input is compared with the negative adjusted input, resulting in a first differential adjusted input; the positive reference voltage is compared with the negative reference voltage, resulting in a first differential reference voltage; and the first differential adjusted input is then compared with the first differential reference voltage;
a second comparator which performs a two-input comparison, wherein the positive adjusted input is compared with the negative adjusted input, resulting in a second differential adjusted input; and
a third comparator which performs a four-input comparison, wherein the positive adjusted input is compared with the negative adjusted input, resulting in a third differential adjusted input; the negative reference voltage is compared with the positive reference voltage, resulting in a third differential reference voltage; and the third differential adjusted input is then compared with the third differential reference voltage.

7. The multi-bit per cycle SAR ADC of claim 1, wherein the reference generator comprises a DAC.

8. The multi-bit per cycle SAR ADC of claim 7, wherein the DAC of the reference generator comprises a capacitive DAC.

9. The multi-bit per cycle SAR ADC of claim 1, wherein some cycles of an m-bit per cycle SAR ADC are performed to convert n bit(s) per cycle, where n<m.

10. The multi-bit per cycle SAR ADC of claim 9, wherein each said comparator has n bit(s) of offset accuracy for the m-bit per cycle SAR ADC, where n<m.

11. The multi-bit per cycle SAR ADC of claim 9, wherein the cycle of converting n bit(s) per cycle is latter than the cycle of converting m bits per cycle.

* * * * *